March 17, 1970 R. S. HUMPHRIES 3,501,654
MINIATURE PRESSURE TRANSDUCER
Filed June 12, 1967

INVENTOR
RICHARD S. HUMPHRIES

BY Hughes, Rothwell, Mion, Zinn & Macpeak
ATTORNEYS

United States Patent Office 3,501,654

Patented Mar. 17, 1970

3,501,654

MINIATURE PRESSURE TRANSDUCER

Richard S. Humphries, Addison, N.Y., assignor to Corning Glass Works, Corning, N.Y., a corporation of New York Filed June 12, 1967, Ser. No. 645,149
Int. Cl. H01v 7/00
U.S. Cl. 310—8.9 5 Claims

ABSTRACT OF THE DISCLOSURE

A highly sensitive miniature pressure transducer capable of detecting pressure variations as small as $10^{-3}$ pounds per square inch at a frequency of 100 kc. per second. A metal oxide semiconductor field effect transistor amplifier is encapsulated with a hollow cylindrical piezoelectric crystal which is completely shielded by a conductive coating. The high output impedance of the crystal is matched by the high input impedance of the field effect transistor whose output may be further amplified by a conventional junction transistor amplifier.

BACKGROUND OF THE INVENTION

Field of the invention

The invention relates to the field of piezoelectric devices for converting pressure variations into corresponding electrical signals.

Prior art

The general combination of a piezoelectric crystal and a field effect transistor is in the prior art.

SUMMARY

The invention relates broadly to an improved piezoelectric transducer which is capable of detecting pressure variations as small as $10^{-3}$ p.s.i. at 100 kc. per second. This result is accomplished in novel structure comprising a field effect transistor encapsulated within a hollow cylindrical piezoelectric crystal. The crystal is completely encased in a conductive coating which electrically shields both the crystal and the field effect transistor.

Figure 4:
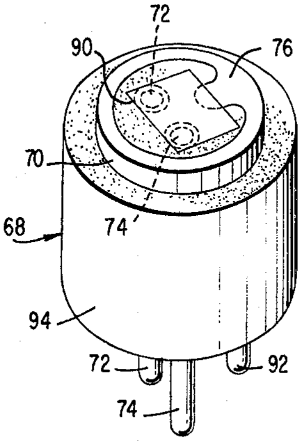
FIGURE 4 is a perspective view of the encapsulated field effect transistor in a second embodiment of the invention.
Figure 5A:
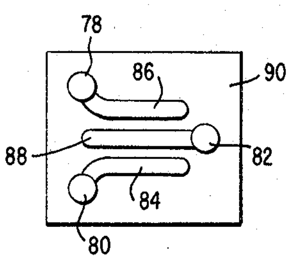
Figure 5B:
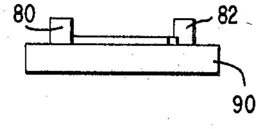

FIGURE *5a* is a plan view of the transistor in FIGURE 4; and

FIGURE *5b* is a front view of FIGURE *5a*.

DESCRIPTION OF THE PREFERRED EMBODIMENT

Figure 1:
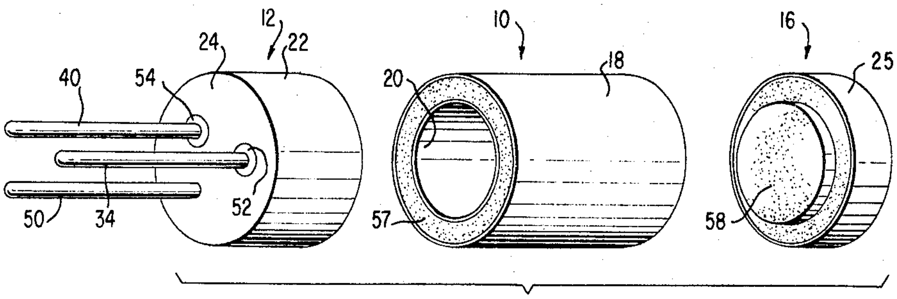
FIGURE 1 is an exploded view of the improved miniature transducer.
Figure 2:
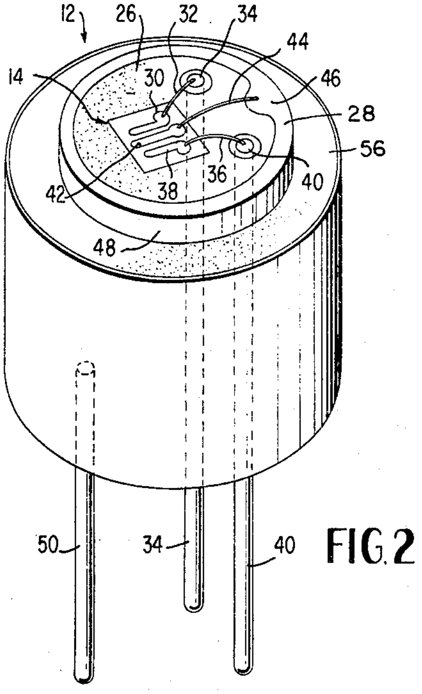
FIGURE 2 is a perspective view of the encapsulated field effect transistor in one embodiment of the invention.

As shown in FIGURES 1 and 2, the pressure transducer consists of a hollow cylindrical piezoelectric crystal 10, a solid lower end cap 12 carrying a metal oxide semiconductor (MOS) field effect transistor (FET) chip 14, and a solid upper end cap 16. Crystal 10 may be a lead zirconate titanate ceramic, for example, the end caps may be made of alumina which is an insulating material and the chip 14 may be silicon. The outer surface of crystal 10 is plated with a conductive coating 18, and the inner surface is plated with a conductive coating 20. Lower end cap 12 has a conductive coating 22 on its cylindrical surface, and a condutive coating 24 on its lower face. Upper end cap 16 has a conductive coating 25 on its exterior surfaces.

As shown in FIGURE 2, the metal oxide semiconductor field effect transistor chip 14 is mounted on the top surface 26 of a circular projection 28 of end cap 12. The source electrode 30 of the transistor 14 is connected by a very short lead 32 to a conductive pin 34 which extends from the surface 26 to the lower face of end cap 12 and out through conductive coating 24. Similarly, a lead 36 connects the drain electrode 38 of field effect transistor 14 to a pin 40 which also extends from upper surface 26 downwardly through alumina cap 12 and projects from conductive coating 24. The gate electrode 42 of transistor 14 is connected via a lead 44 to a conductive coating 46 which extends around the periphery of surface 26 of the alumina projection 28. A conductive coating 48 on the cylindrical surface of projection 28 engages the coating 46 around the periphery of the projection. Coating 46 contacts the conductive coating 20 when the end cap 12 is inserted in the crystal 10. A ground pin 50 is mechanically supported in a hole bored in the lower face of end cap 20 and is electrically connected to the conductive coating 24 which in turn is electrically connected to conductive coatings 18 and 25 when both end caps are inserted in crystal 10. Pins 34 and 40 are electrically isolated from end cap 12 by insulators 52 and 54, respectively, which surround the portions of the pins within the body of the end cap.

As can be seen from the exploded view of FIGURE 1, the upper surface 56 of end cap 12 engages the surface 57 of the cylindrical piezoelectric crystal 10. The upper end cap 16 has a circular alumina projection 58 whose diameter is substantially the same as the internal diameter of the crystal 10 and the diameter of projection 28. When the two end caps 12 and 16 are inserted in the piezoelectric crystal 10 and hermetically sealed thereto, air or other gas is trapped between the end caps. When the transducer thus formed is subjected to pressure variations, the components of such variations directed radially of the crystal 10 generate a piezoelectric voltage between the conductive coatings 18 and 20 which act as the electrodes of crystal 10. The generated voltage is proportional to the external radial pressure on the crystal, i.e. the pressure differential between that exerted by the trapped gaseous medium on the inner wall of the cylindrical crystal and the radial pressure exerted by external forces on the outer wall of the crystal.

FIGURE 2 shows one mode of mounting the MOS field effect transistor 14. The silicon transistor chip 14 is placed on a piece of gold foil (not shown) fixed to the alumina in the surface 26 of projection 28 and fired at approximately 360° C. The leads 32, 36 and 44 are then connected between the three transistor electrodes and the corresponding transducer terminals 34, 40 and 46.

Figure 3:
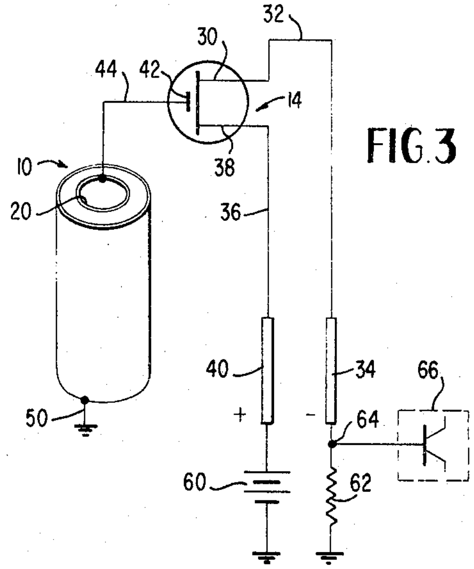
FIGURE 3 is a schematic circuit diagram of the transducer and associated circuits.

FIGURE 3 is a schematic diagram of a circuit in which the transducer is adapted to be used. The reference numerals used in FIGURES 1 and 2 indicate corresponding parts in FIGURE 3. The lead 50 connected to the conductive coatings 24, 22, 18 and 25 on crystal 10 and end caps 12 and 16 are connected to ground or reference potential to provide a complete shield around the transducer. The inner electrode 20 of the piezoelectric crystal 10 is connected to the gate 42 of the metal oxide semiconductor field effect transistor 14. The drain electrode 38 of the transistor is connected through lead 36 and pin 40 to the positive terminal of a fifteen volt battery 60 whose negative terminal is grounded. The source electrode 30 of transistor 14 is connected through lead 32, pin 34 and a ten kilohm resistor 62 to ground. The junction 64 of the resistor 62 and the pin 34 is connected to the input of a conventional transistor amplifier stage 66. Additional amplifying stages may be connected to the output of stage 70.

In operation, when the crystal 10 is subjected to zero external pressure, the piezoelectric gate voltage is substantially zero and the minimum current flows from battery 60 through the drain to the source of transistor 14 and through resistor 62, thereby developing a minimum voltage across resistor 62. As the magnitude of pressure variations to which the crystal is subjected increases, the gate voltage applied to the gate electrode 42 increases and, with the transistor operating in the enhancement mode, the current flowing from the drain to the source of the transistor increases, thereby proportionately increasing the voltage developed across resistor 62. The pressure responsive voltage at point 64 is fed to amplifier stage 66. The output of stage 66 may be further amplified and fed to a suitable pressure indicator or control mechanism.

The MOS-FET transistor is designed to sense high frequency but small variations in pressure. For example, the piezoelectric crystal 10 in one embodiment is 0.125 inch long, has an outside diameter of 0.125 inch and a wall thickness of 0.025 inch. The resonant frequency of such a crystal is on the order of 300 kc. The crystal has a capacitance of 1100 pf. and a response of 2.5 microvolts per microbar (approximately 150 microvolts per .001 p.s.i.). The metal oxide semiconductor field effect transistor has a high input impedance which matches the high impedance of the piezoelectric crystal, and a low output impedance which matches the low input impedance of a conventional junction transistor amplifier. In this case, transistor 14 reduces the output impedance of the piezoelectric crystal from approximately $10^{12}$ ohms to less than $10^5$ ohms. The low output impedance of the field effect transistor 14 matches the low input impedance of the transistor amplifier stage 66.

Another advantage of the structure illustrated in FIGURES 1 and 2 is that the transistor leads 32, 36 and 44 have almost zero length, thereby reducing lead capacitance to almost zero and preserving the high frequency capability of the transistor circuit. The continuous metal coating on the outside of the transducer acts as a shield both to piezoelectric crystal 10 and also to the high impedance input circuit of the transistor.

FIGURES 4 and *5a* and *5b* illustrate another embodiment of the invention showing a lower alumina end cap 68 having a projection 70 on which the source, drain and gate terminals 72, 74 and 76 are positioned such that they match corresponding pillars 78, 80 and 82 connected to the source, drain and gate electrodes 84, 86 and 88, respectively, of an MOS-FET chip 90. The chip is inverted so that the pillars engage the corresponding terminals, and the pillars are then bonded to the terminals. A ground pin or terminal 92 is electrically connected to the conductive coating 94 plated on the cylindrical surface and lower face of end cap 68. The embodiment of FIGURES 4 and *5a* and *5b* provides a pressure transducer having a smaller diameter than that of the FIGURE 2 embodiment because the inner diameter of the cylindrical piezoelectric crystal 10, and thereby the complete transducer, is limited substantially only by the size of the transistor chip. In the FIGURE 2 embodiment, the larger diameter is required in order to place the chip 14 beside the source, drain and gate terminals rather than directly over them as in FIGURE 4. Furthermore, the pillar-type transistor leads of the FIGURE 4 embodiment are even shorter than the transistor leads of the embodiment illustrated in FIGURE 2. The circuit diagram of FIGURE 3 also applies to the embodiment of FIGURE 4.

The pressure transducer formed by the piezoelectric crystal 10 and an encapsulated MOS transistor as described above and illustrated in the drawing is capable of detecting pressure changes as small as $10^{-3}$ pounds per square inch at frequencies up to 100 kilocycles per second. It is particularly useful for measuring the very small, high frequency pressure variations encountered in fluidics technology, but may also be used to detect pressure variations as low as 10 c.p.s. as encountered in a microphone, for example. Furthermore, the arrangement of the field effect transistor encapsulated within the cylindrical crystal results in less restriction or damping of the distortions of the crystal than found in prior art devices, thereby providing a transducer which has greater sensitivity and better frequency response.

While the invention has been particularly shown and described with reference to preferred embodiments thereof, it will be understood by those skilled in the art that various changes in form and details may be made therein without departing from the spirit and scope of the invention.

What is claimed is:

1. A miniature pressure transducer comprising (a) a hollow cylindrical piezoelectric crystal which generates voltage signals in response to pressure variations applied thereto, (b) cylindrical end caps hermetically sealed to opposite ends of said crystal, (c) a field effect transistor having gate, source and drain electrodes mounted on the face of one of said end caps within said crystal, (d) source and drain leads extending from said face through the opposite face of said one end cap to the exterior of said transducer, (e) means electrically connecting said source and drain leads to the source and drain electrodes, respectively, of said transistor, and (f) means for applying said voltage signals to the gate electrode of said transistor including (1) a conductive coating on the inner surface of said cylindrical crystal, and (2) a gate lead on said face of said one end cap electrically connecting said conductive coating to the gate electrode of said transistor.

2. A miniature pressure transducer as defined in claim 1 further comprising a continuous conductive shield covering the exterior surface of said transducer.

3. A miniature pressure transducer as defined in claim 1 wherein (a) said transistor and said gate, source and drain leads are disposed adjacent each other on said face, and further comprising (b) individual conductors interconnecting corresponding transistor electrodes and said leads.

4. A miniature pressure transducer as defined in claim 1 wherein (a) said means electrically connecting said transistor electrodes and said leads comprise electrically conducting individual pillars connected to each electrode of the transistor and projecting substantially perpendicularly from the general plane of said transistor, and further comprising (b) means mounting said transistor on said face such that all of said pillars engage the corresponding leads on said circular surface.

5. A miniature pressure transducer as defined in claim 2 further comprising an external lead electrically connected to said shield for connecting said shield to a reference potential.

References Cited

UNITED STATES PATENTS

| | | | |
|---|---|---|---|
| 3,322,980 | 5/1967 | Faure | 310—9.1 X |
| 3,290,564 | 12/1966 | Wolff | 174—50.5 X |
| 3,234,438 | 2/1966 | Glickman | 174—50.5 X |
| 3,230,403 | 1/1966 | Lewis et al. | 310—9.6 X |
| 3,178,681 | 4/1965 | Horsman et al. | 310—8.2 X |
| 2,972,006 | 2/1961 | Shoor | 310—8.4 X |
| 2,808,522 | 10/1957 | Dranetz | 310—8.4 X |
| 2,775,434 | 12/1956 | Probst | 310—8.9 X |
| 2,618,698 | 11/1952 | Janssen | 310—9.6 X |

MILTON O. HIRSHFIELD, Primary Examiner

MARK O. BUDD, Assistant Examiner

U.S. Cl. X.R.

310—9.1, 9.6, 9.7